(12) United States Patent
Kim et al.

(10) Patent No.: US 8,568,944 B2
(45) Date of Patent: Oct. 29, 2013

(54) REFLECTIVE EXTREME ULTRAVIOLET MASK AND METHOD OF MANUFACTURING THE SAME

(75) Inventors: Hoon Kim, Suwon-si (KR); Young-Su Sung, Chuncheon-si (KR); Young-Kuen Kim, Seoul (KR); Dong-Seok Nam, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 40 days.

(21) Appl. No.: 13/422,206

(22) Filed: Mar. 16, 2012

(65) Prior Publication Data
US 2012/0237860 A1  Sep. 20, 2012

(30) Foreign Application Priority Data
Mar. 17, 2011  (KR) .................. 10-2011-0023656

(51) Int. Cl.
*G03F 1/22* (2012.01)
*G03F 1/24* (2012.01)
(52) U.S. Cl.
USPC ............................................................ 430/5

(58) Field of Classification Search
USPC .......................................... 430/5, 30; 378/35
See application file for complete search history.

(56) References Cited

U.S. PATENT DOCUMENTS

| | | | |
|---|---|---|---|
| 7,101,645 B1 | 9/2006 | La Fontaine et al. | |
| 2002/0192571 A1 | 12/2002 | Schwarzl | |
| 2010/0112464 A1 | 5/2010 | Kanamitsu | |
| 2011/0027703 A1* | 2/2011 | Shoki | ................ 430/5 |

FOREIGN PATENT DOCUMENTS

| | | |
|---|---|---|
| JP | 2010-109164 A | 5/2010 |
| KR | 10-2010-0003835 A | 1/2010 |

* cited by examiner

*Primary Examiner* — Stephen Rosasco
(74) *Attorney, Agent, or Firm* — Lee & Morse, P.C.

(57) ABSTRACT

A reflective EUV mask and a method of manufacturing the same, the reflective EUV mask including a mask substrate having an exposing region and a peripheral region, the mask substrate including a light scattering crystalline portion that scatters light incident to the peripheral region and that decreases reflectivity of the peripheral region; a reflective layer on an upper surface of the mask substrate, the reflective layer having a first opening that exposes the crystalline portion; and an absorbing layer pattern on an upper surface of the reflective layer, the absorbing layer pattern having a second opening in fluidic communication with the first opening.

18 Claims, 4 Drawing Sheets

REFLECTIVE EXTREME ULTRAVIOLET MASK AND METHOD OF MANUFACTURING THE SAME

CROSS-REFERENCE TO RELATED APPLICATION

Korean Patent Application No. 10-2011-0023656, filed on Mar. 17, 2011, in the Korean Intellectual Property Office, and entitled: "Reflective Extreme Ultraviolet Mask and Method of Manufacturing the Same," is incorporated by reference herein in its entirety.

BACKGROUND

1. Field

Embodiments relate to a reflective extreme ultraviolet mask and a method of manufacturing the same.

2. Description of the Related Art

As a design rule of a semiconductor device has been greatly reduced, a wavelength of a light used in an exposing process has been shortened. Thus, a minute pattern may not be formed using a light such as an I-line, a G-line, a KrF, an ArF, etc., and extreme ultraviolet (EUV) light having a short wavelength may instead be used in the exposing process.

However, the EUV light may have high energy. Thus, most of the EUV light may be absorbed in an absorbing layer of an EUV mask, and the EUV light may not arrive on a semiconductor substrate. Accordingly, a reflective EUV mask capable of using reflected EUV light has been considered.

SUMMARY

Embodiments are directed to a reflective extreme ultraviolet mask and a method of manufacturing the same.

The embodiments may be realized by providing a reflective EUV mask including a mask substrate having an exposing region and a peripheral region, the mask substrate including a light scattering crystalline portion that scatters light incident to the peripheral region and that decreases reflectivity of the peripheral region; a reflective layer on an upper surface of the mask substrate, the reflective layer having a first opening that exposes the crystalline portion; and an absorbing layer pattern on an upper surface of the reflective layer, the absorbing layer pattern having a second opening in fluidic communication with the first opening.

The crystalline portion may have a crystalline facet substantially parallel with an incident direction of the light.

The reflective layer may include an alternately stacked silicon layer and molybdenum layer.

The absorbing layer pattern may include an EUV absorbing layer pattern on the upper surface of the reflective layer; and a DUV absorbing layer pattern on an upper surface of the EUV absorbing layer pattern.

The EUV absorbing layer pattern may include a tantalum boron nitride layer.

The DUV absorbing layer pattern may include a tantalum boron oxide layer.

The absorbing layer pattern may include an exposing pattern in the exposing region.

The embodiments may also be realized by providing a method of manufacturing a reflective EUV mask, the method including forming a reflective layer on an upper surface of a mask substrate, the substrate including an exposing region and a peripheral region; forming an absorbing layer on an upper surface of the reflective layer; etching the reflective layer and the absorbing layer in the peripheral region to form a first opening in the reflective layer, the first opening exposing the upper surface of the mask substrate, and an absorbing layer pattern having a second opening in fluidic communication with the first opening; and forming a crystalline portion at a portion of the upper surface of the mask substrate exposed through the first opening and the second opening such that the crystalline portion scatters light incident to the peripheral region and decreases reflectivity of the peripheral region.

Forming the crystalline portion may include converting portions of the upper surface of the mask substrate in an amorphous state into a crystalline state.

Converting the amorphous state into the crystalline state may include irradiating a laser to the upper surface of the mask substrate.

The laser may be irradiated in a direction substantially parallel with an incident direction of the light and provides the crystalline portion with a crystalline facet substantially parallel with the incident direction of the light.

Forming the absorbing layer may include forming an EUV absorbing layer on the upper surface of the reflective layer; and forming a DUV absorbing layer on an upper surface of the EUV absorbing layer.

Forming the absorbing layer pattern may further include etching the absorbing layer in the exposing region to form an exposing pattern.

The exposing pattern may be formed simultaneously with the second opening.

The embodiments may also be realized by providing a reflective EUV mask including a mask substrate having an exposing region and a peripheral region, the mask substrate including a light scattering crystalline portion in the peripheral region; a reflective layer on an upper surface of the mask substrate, the reflective layer including a first opening therethrough, the first opening overlying the crystalline portion of the mask substrate; and an absorbing layer pattern on an upper surface of the reflective layer, the absorbing layer pattern having a second opening therethrough, the second opening overlying the first opening.

The crystalline portion may have a crystalline facet that is substantially perpendicular to an upper surface of the mask substrate.

The crystalline portion may be configured to scatter light incident to the peripheral region and to decrease reflectivity of the peripheral region.

The crystalline portion may be configured to scatter light having a wavelength of about 100 nm to about 400 nm.

BRIEF DESCRIPTION OF THE DRAWINGS

The embodiments will become apparent to those of ordinary skill in the art by describing in detail exemplary embodiments with reference to the attached drawings, in which.

DETAILED DESCRIPTION

Figure 1:
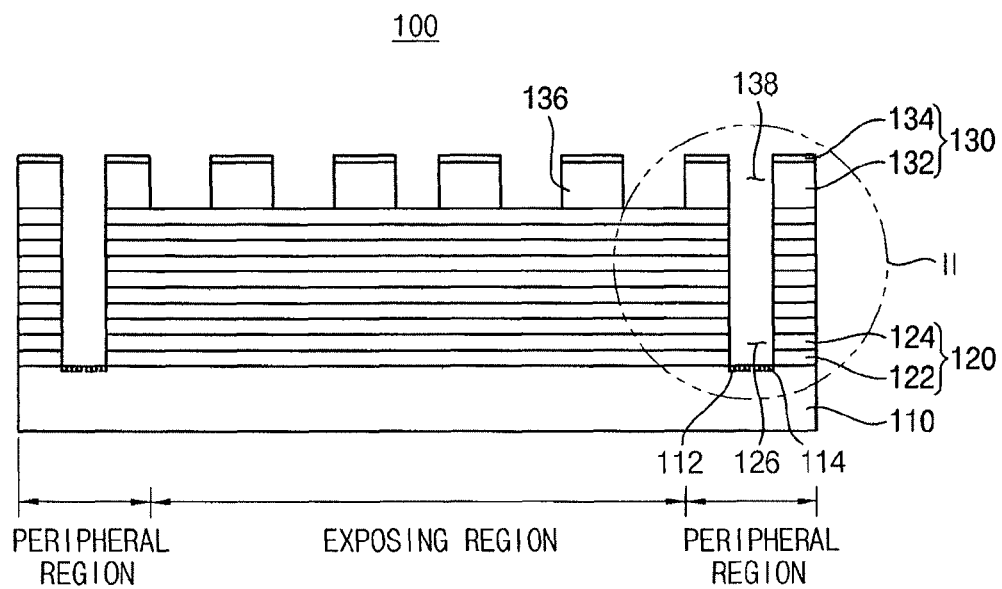
FIG. 1 illustrates a cross-sectional view of a reflective EUV mask in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Reflective EUV Mask

Figure 2:
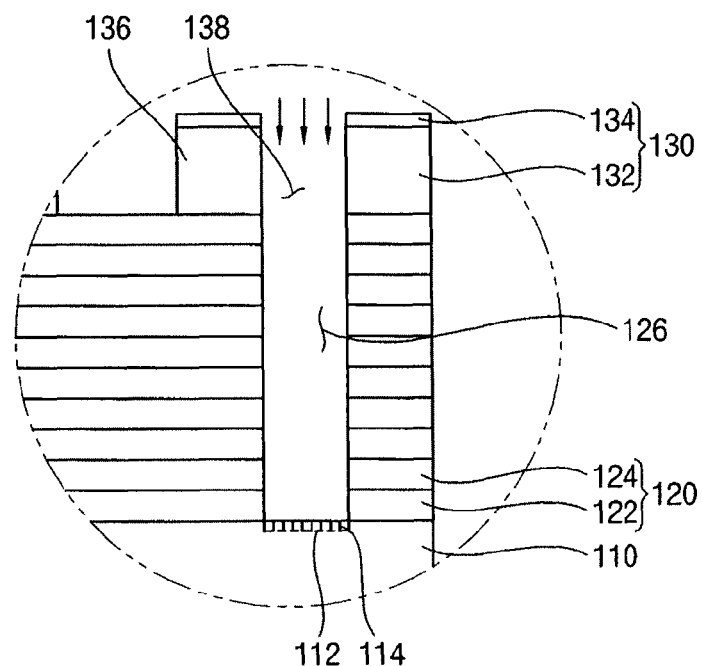
FIG. 2 illustrates an enlarged cross-sectional view of a portion "II" of FIG. 1.
Figure 3:
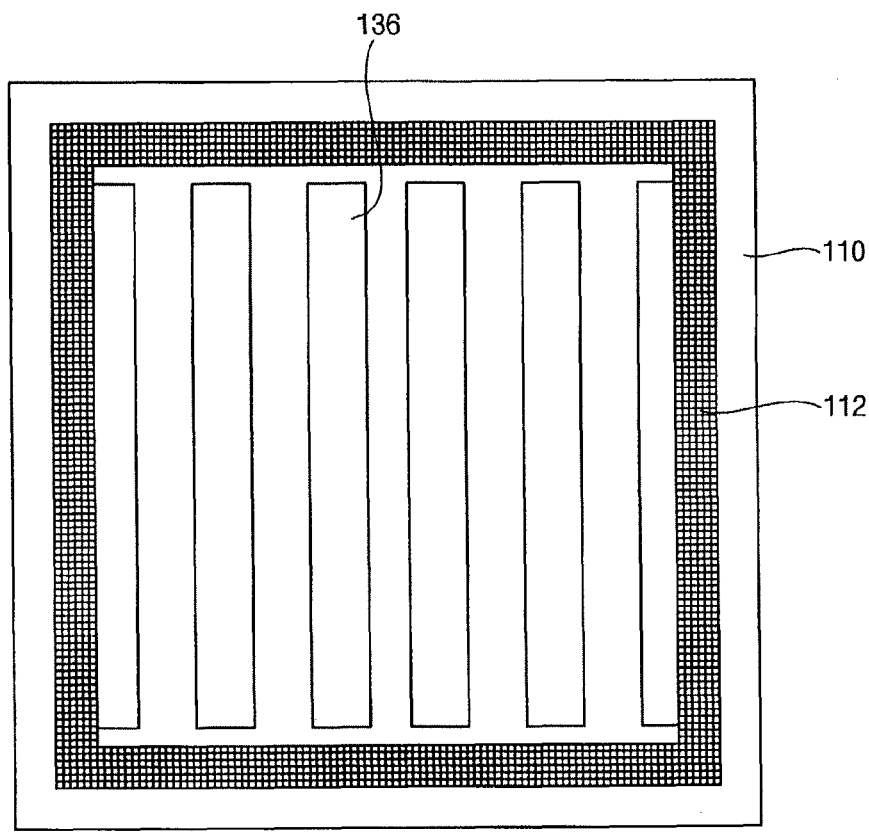
FIG. 3 illustrates a plan view of the reflective EUV mask of FIG. 1.

FIG. 1 illustrates a cross-sectional view of a reflective EUV mask in accordance with an embodiment. FIG. 2 illustrates an enlarged cross-sectional view of a portion "II" of FIG. 1. FIG. 3 illustrates a plan view of the reflective EUV mask of FIG. 1.

Referring to FIGS. 1 to 3, a reflective EUV mask 100 of the present embodiment may include a mask substrate 110, a reflective layer 120, and an absorbing layer pattern 130.

The mask substrate 110 may include an exposing region and a peripheral region.

In an implementation, the mask substrate 110 may have a rectangular shape. The exposing region may be positioned at a central portion of the mask substrate 110. The peripheral region may be positioned at an edge portion of the mask substrate 110 to surround the exposing region.

In an implementation, the mask substrate 110 may include a crystalline portion 112. The crystalline portion 112 may scatter EUV light and DUV light reflected from the mask substrate 110. The crystalline portion 112 may be formed at an upper surface of the mask substrate 110 in the peripheral region. The crystalline portion 112 may be formed by crystallizing amorphous portions of the mask substrate 110. For example, a laser may be irradiated to the upper surface of the mask substrate 110 in the peripheral region to convert portions of the mask substrate 110 from an amorphous state into a crystalline state. Thus, the crystalline portion 112 may have a crystalline facet 114 substantially parallel with an irradiation direction of the laser. For example, the crystalline facet 114 may be substantially perpendicular to an upper surface of the mask substrate 110. The crystalline portion 112 may scatter the EUV light and the DUV light incident to the upper surface of the mask substrate 110 to help suppress interference of the DUV light and the EUV light with EUV light reflected from the reflective layer 120 in the exposing region. The crystalline portion 112 may scatter the DUV light having a wavelength of about 100 nm to about 400 nm to help reduce and/or prevent the DUV light (having the wavelength of about 100 nm to about 400 nm) from interfering with the EUV light reflected from the reflective layer 120.

The reflective layer 120 may be formed on the upper surface of the mask substrate 110. In an implementation, the reflective layer 120 may include an alternately stacked molybdenum layer 122 and silicon layer 124. The reflective layer 120 may reflect EUV light irradiated to the reflective EUV mask 100 during an exposing process.

In an implementation, the reflective layer 120 may have a first opening 126 that exposes the crystalline portion 112. For example, the first opening 126 may be formed or extend through the reflective layer 120 in the peripheral region and may overlie the crystalline portion 112 of the mask substrate 110. The first opening 126 may be formed by, e.g., etching the reflective layer 120 in the peripheral region.

The absorbing layer pattern 130 may be formed on the reflective layer 120. In an implementation, portions of the absorbing layer pattern 130 in the exposing region may have an exposing pattern 136. The exposing pattern 136 may have a plurality of openings that expose an upper surface of the reflective layer 120. Thus, EUV light irradiated to the reflective EUV mask 100 may be incident to the reflective layer 120 through the openings of the absorbing layer pattern 130.

In an implementation, the absorbing layer pattern 130 may include an EUV absorbing layer pattern 132 (formed on the reflective layer 120), and a DUV absorbing layer pattern 134 (formed on the EUV absorbing layer pattern 132). The EUV absorbing layer pattern 132 may include, e.g., a tantalum boron nitride (TaBN) layer. The DUV absorbing layer pattern 134 may include, e.g., a tantalum boron oxide (TaBO) layer.

The absorbing layer pattern 130 may include a second opening 138 that is in fluidic communication with the first opening 126. For example, the second opening 138 may overlie the first opening 126. Thus, the crystalline portion 112 may be exposed through the first opening 126 and the second opening 138.

In an implementation, the first opening 126 and the second opening 138 may be formed by different processes. In another implementation, the first opening 126 and the second opening 138 may be formed in a single step by etching the reflective layer 120 together with the absorbing layer pattern 130.

According to the present embodiment, the crystalline portion of the mask substrate may scatter the DUV light to thereby reduce reflectivity of the mask substrate in the peripheral region. Thus, a desired photoresist pattern may be formed by the reflective EUV mask.

Method of Manufacturing a Reflective EUV Mask

FIGS. 4 to 9 illustrate cross-sectional views of stages in a method of manufacturing the reflective EUV mask of FIG. 1.

Figure 4:
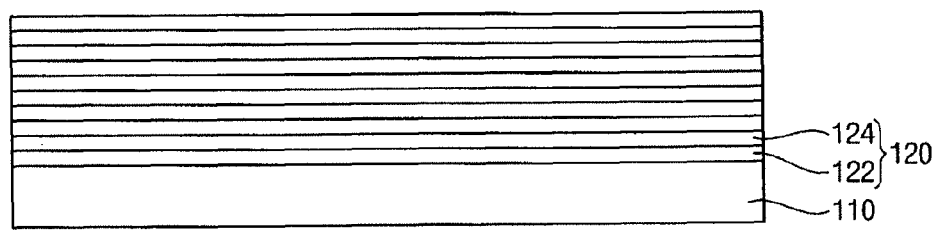
FIGS. 4 to 9 illustrate cross-sectional views of stages in a method of manufacturing the reflective EUV mask of FIG. 1.

Referring to FIG. 4, the reflective layer 120 may be formed on the upper surface of the mask substrate 110. In an implementation, the mask substrate 110 may include the exposing region and the peripheral region. The exposing region may be positioned at a central portion of the mask substrate 110. The peripheral region may be positioned at an edge portion of the mask substrate 110 to surround the exposing region.

In an implementation, the reflective layer 120 may include the alternately stacked molybdenum layer 122 and silicon layer 124. In another implementation, the reflective layer 120 may include other layers in place of the molybdenum layer 122 and the silicon layer 124.

Figure 5:
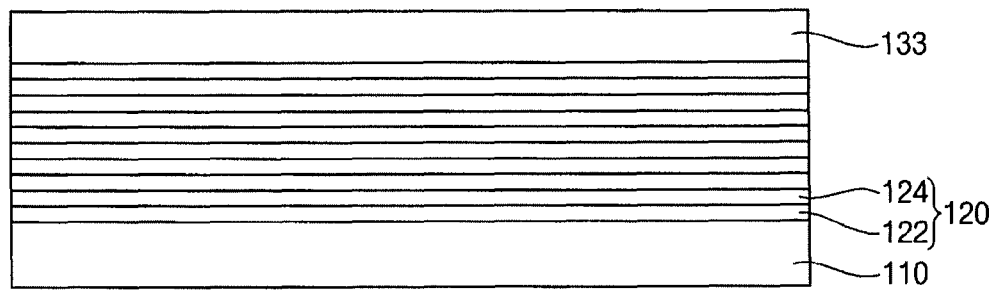

Referring to FIG. 5, an EUV absorbing layer 133 may be formed on the upper surface of the reflective layer 120. In an implementation, the EUV absorbing layer 133 may include, e.g., a tantalum boron oxide layer.

Figure 6:
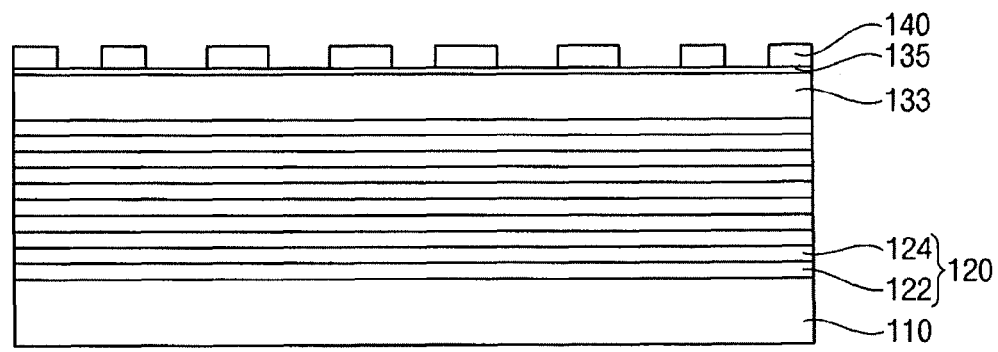

Referring to FIG. 6, a DUV absorbing layer 135 may be formed on an upper surface of the EUV absorbing layer 133. In an implementation, the DUV absorbing layer 135 may include, e.g., a tantalum boron oxide layer. A photoresist pattern 140 may then be formed on an upper surface of the DUV absorbing layer 135.

Figure 7:
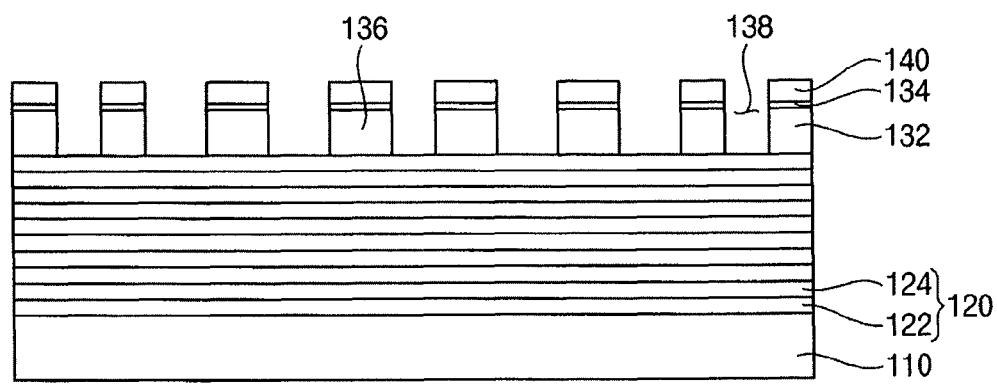

Referring to FIG. 7, the DUV absorbing layer 135 and the EUV absorbing layer 133 may be etched using the photoresist pattern 140 as an etch mask to form the DUV absorbing layer pattern 134 and the EUV absorbing layer pattern 132. In an implementation, portions of the EUV absorbing layer pattern 132 and the DUV absorbing layer pattern 134 in the exposing region may correspond to the exposing pattern 136. Portions of the EUV absorbing layer pattern 132 and the DUV absorbing layer pattern 134 in the peripheral region may include the second opening 138 that exposes the upper surface of the reflective layer 120.

Figure 8:
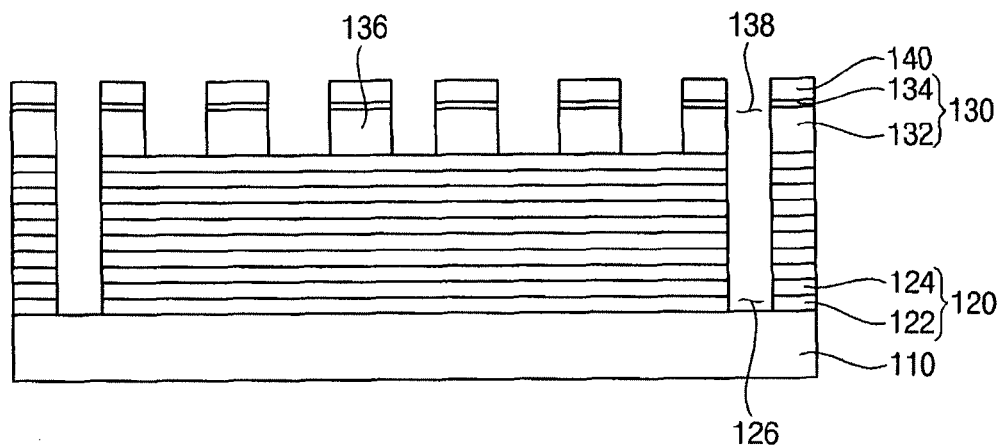

Referring to FIG. 8, areas of the reflective layer 120 exposed through the second opening 138 may be etched to form the first opening 126 in the reflective layer 120 in the such that the first opening 126 is in fluidic communication with the second opening 138. Thus, the upper surface of the mask substrate 110 in the peripheral region may be exposed through the first opening 126 and the second opening 138.

Figure 9:
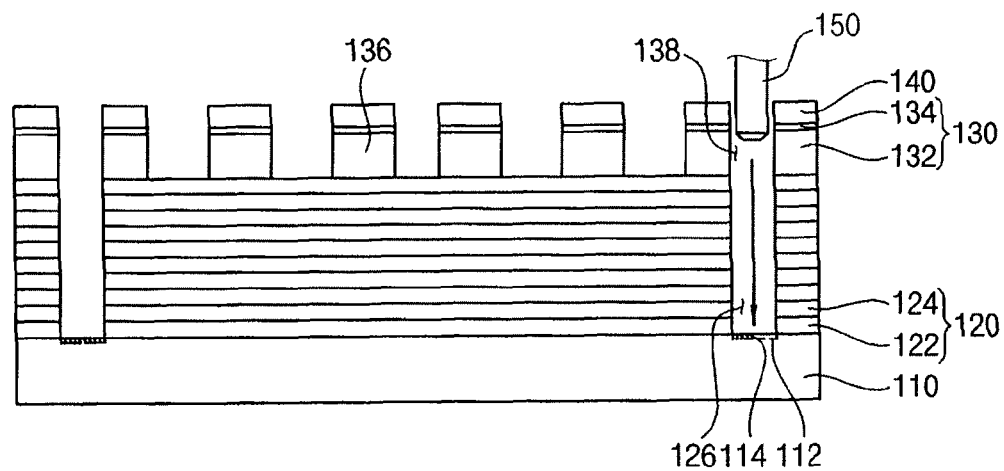

Referring to FIG. 9, a laser irradiator 150 may irradiate a laser to the upper surface of the mask substrate 110 exposed through the first opening 126 and the second opening 138. Portions of the mask substrate 110 (exposed through the first opening 126 and the second opening 138) in an amorphous state may be converted into the crystalline state to thereby form the crystalline portion 112 having the crystalline facet 114. In an implementation, the laser may be irradiated in a direction substantially parallel with an axial direction of the first opening 126 and the second opening 138. Thus, the crystalline facet 114 may be substantially parallel with the irradiation direction of the laser.

The photoresist pattern 140 may then be removed to complete the reflective EUV mask 100 of FIG. 1. In an implementation, the photoresist pattern 140 may be removed by, e.g., a stripping process and/or an ashing process.

By way of summation and review, an EUV mask may include a mask substrate, a reflective layer on the mask substrate, and an absorbing layer pattern on the reflective layer. An edge region of the absorbing layer pattern may correspond to a non-patterned region that may not be used in an exposing process. EUV light reflected from a portion of the reflective layer under the edge region of the absorbing layer pattern may interfere with EUV light reflected from a portion of the reflective layer under a patterned region of the absorbing layer pattern. Therefore, a decrease in reflectivity of the portion of the reflective layer under the edge region of the absorbing layer pattern may be desirable.

In order to decrease the reflectivity of the portion of the reflective layer, the edge region of the absorbing layer pattern and the portion of the reflective layer may be removed by a plasma etching process using a photoresist pattern to form a trench or opening that exposes an upper surface of the mask substrate. More specifically, in a reflective EUV mask, a DUV light having a wavelength of about 100 nm to about 400 nm may be reflected from a peripheral region of a mask substrate. The reflected DUV light may interfere with a light reflected from the exposing region of the mask substrate. The light interference may cause an abnormal photoresist pattern.

That is, a large amount of a deep ultraviolet (DUV) light may be reflected from the exposed upper surface of the mask substrate. Thus, light interference may occur, and a desired photoresist pattern may not be formed.

The embodiments provide a reflective EUV mask having low reflectivity.

According to the embodiments, a laser may be irradiated to the peripheral region of the mask substrate to form a crystalline portion. The crystalline portion may scatter the incident light to decrease a reflectivity of the peripheral region. In particular, the crystalline portion in the upper surface of the mask substrate exposed through the first and second openings may scatter light (having a wavelength of about 100 nm to about 400 nm) incident to the peripheral region, so that the exposed upper surface of the mask substrate may have a low reflectivity. Thus, a desired photoresist pattern may be formed using the reflective EUV mask. As a result, a desired pattern may be accurately formed using the desired photoresist pattern.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A reflective EUV mask, comprising:
    a mask substrate having an exposing region and a peripheral region, the mask substrate including a light scattering crystalline portion that scatters light incident to the peripheral region and that decreases reflectivity of the peripheral region;
    a reflective layer on an upper surface of the mask substrate, the reflective layer having a first opening that exposes the crystalline portion; and
    an absorbing layer pattern on an upper surface of the reflective layer, the absorbing layer pattern having a second opening in fluidic communication with the first opening.

2. The reflective EUV mask as claimed in claim 1, wherein the crystalline portion has a crystalline facet substantially parallel with an incident direction of the light.

3. The reflective EUV mask as claimed in claim 1, wherein the reflective layer includes an alternately stacked silicon layer and molybdenum layer.

4. The reflective EUV mask as claimed in claim 1, wherein the absorbing layer pattern includes:
    an EUV absorbing layer pattern on the upper surface of the reflective layer; and
    a DUV absorbing layer pattern on an upper surface of the EUV absorbing layer pattern.

5. The reflective EUV mask as claimed in claim 4, wherein the EUV absorbing layer pattern includes a tantalum boron nitride layer.

6. The reflective EUV mask as claimed in claim 4, wherein the DUV absorbing layer pattern includes a tantalum boron oxide layer.

7. The reflective EUV mask as claimed in claim 1, wherein the absorbing layer pattern includes an exposing pattern in the exposing region.

8. A method of manufacturing a reflective EUV mask, the method comprising:
    forming a reflective layer on an upper surface of a mask substrate, the substrate including an exposing region and a peripheral region;
    forming an absorbing layer on an upper surface of the reflective layer;
    etching the reflective layer and the absorbing layer in the peripheral region to form:
        a first opening in the reflective layer, the first opening exposing the upper surface of the mask substrate, and
        an absorbing layer pattern having a second opening in fluidic communication with the first opening; and
    forming a crystalline portion at a portion of the upper surface of the mask substrate exposed through the first opening and the second opening such that the crystalline portion scatters light incident to the peripheral region and decreases reflectivity of the peripheral region.

9. The method as claimed in claim 8, wherein forming the crystalline portion includes converting portions of the upper surface of the mask substrate in an amorphous state into a crystalline state.

10. The method as claimed in claim 9, wherein converting the amorphous state into the crystalline state includes irradiating a laser to the upper surface of the mask substrate.

11. The method as claimed in claim 10, wherein the laser is irradiated in a direction substantially parallel with an incident direction of the light and provides the crystalline portion with a crystalline facet substantially parallel with the incident direction of the light.

12. The method as claimed in claim 8, wherein forming the absorbing layer includes:
    forming an EUV absorbing layer on the upper surface of the reflective layer; and
    forming a DUV absorbing layer on an upper surface of the EUV absorbing layer.

13. The method as claimed in claim 8, wherein forming the absorbing layer pattern further includes etching the absorbing layer in the exposing region to form an exposing pattern.

14. The method as claimed in claim 13, wherein the exposing pattern is formed simultaneously with the second opening.

15. A reflective EUV mask, comprising:
    a mask substrate having an exposing region and a peripheral region, the mask substrate including a light scattering crystalline portion in the peripheral region;
    a reflective layer on an upper surface of the mask substrate, the reflective layer including a first opening therethrough, the first opening overlying the crystalline portion of the mask substrate; and
    an absorbing layer pattern on an upper surface of the reflective layer, the absorbing layer pattern having a second opening therethrough, the second opening overlying the first opening.

16. The reflective EUV mask as claimed in claim 15, wherein the crystalline portion has a crystalline facet that is substantially perpendicular to an upper surface of the mask substrate.

17. The reflective EUV mask as claimed in claim 16, wherein the crystalline portion is configured to scatter light incident to the peripheral region and to decrease reflectivity of the peripheral region.

18. The reflective EUV mask as claimed in claim 17, wherein the crystalline portion is configured to scatter light having a wavelength of about 100 nm to about 400 nm.

* * * * *